United States Patent [19]
Yamashina et al.

[11] Patent Number: 5,559,461
[45] Date of Patent: Sep. 24, 1996

[54] DRIVE CIRCUIT DETECTING SLOW SIGNAL TRANSITION

[75] Inventors: Masakazu Yamashina; Youichi Koseki; Masayuki Mizuno, all of Tokyo, Japan

[73] Assignee: NEC Corporation, Japan

[21] Appl. No.: 495,032

[22] Filed: Jun. 27, 1995

[30] Foreign Application Priority Data

Jun. 28, 1994 [JP] Japan .................... 6-146339

[51] Int. Cl.$^6$ .................. H03K 17/16; H03K 5/22
[52] U.S. Cl. .............. 327/205; 327/14; 327/206; 327/210; 327/170; 326/98; 326/71
[58] Field of Search ............... 327/108, 82, 77, 327/264, 277, 170, 379, 374, 205, 206, 199, 14, 210; 326/71, 98, 82, 87

[56] References Cited

U.S. PATENT DOCUMENTS 5,175,445 12/1992 Kinugasa et al. ............... 327/206

OTHER PUBLICATIONS

"Circuit Design for CMOS VLSI", chapter 4, pp. 158–163.
"Analysis and Design of Digital Integrated Circuits", pp. 337–339.

Primary Examiner—Timothy P. Callahan
Assistant Examiner—Dinh T. Le
Attorney, Agent, or Firm—Whitham, Curtis, Whitham & McGinn

[57] ABSTRACT

A drive circuit includes first and second circuit sections. The first circuit section maintains, during an initial stage of a transient period of an input signal, its output level before the signal transition and supplies after the transient period an output signal responsive to the signal transition. The second circuit section has a first circuit portion receiving the input signal and a second circuit portion, responsive to the input signal, and the output of the first circuit section, to accelerate the signal transition of the first circuit portion. Signal delay in a signal transition due to a large parasitic capacitance and resistance can be recovered by the drive circuit. The drive circuit has a large noise margin and operates at a high-speed and in a wide frequency range.

10 Claims, 19 Drawing Sheets

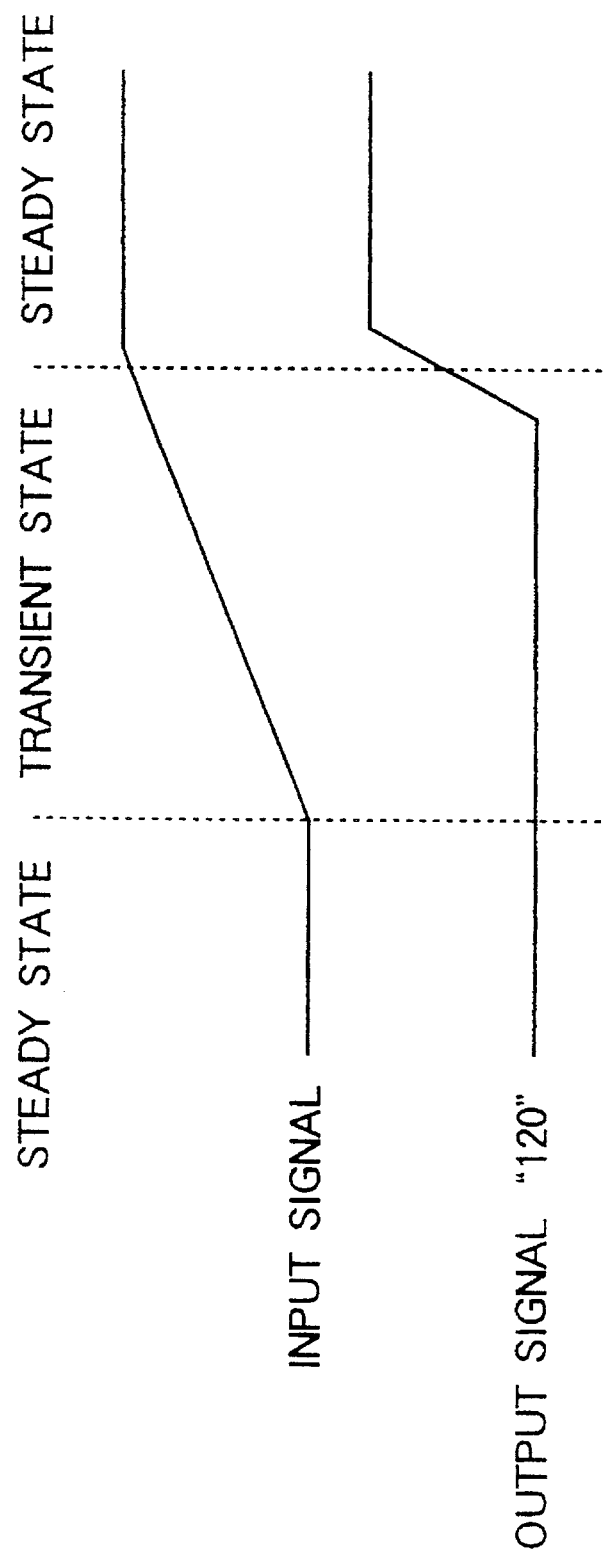

DRIVE CIRCUIT DETECTING SLOW SIGNAL TRANSITION

BACKGROUND OF THE INVENTION (a) Field of the Invention

The present invention relates to a drive circuit detecting a slow signal transition. More specifically it relates to a drive circuit which quickly detects a slow change of a signal on a signal line having a large resistance and a large capacitance to reduce the delay of the signal transition in various circuits such as a multistage pass transistor circuit, a word line drive circuit of a memory, a clock circuit, and a bus circuit.

(b) Description of the Related Art

FIG. 1A shows a conventional high-speed drive circuit adapted for quickly detecting a signal which rises or falls slowly.

The high-speed drive circuit includes serial pMOS transistors 102 and 103 each having a gate connected to an input signal line 101, serial nMOS transistors 105 and 106 connected in series to the pMOS transistors 102 and 103 and 106 each having a gate connected to input signal line 101, a delay circuit 108 having an input connected to an input signal line 101 to output an inverted and delayed signal of an input signal, and a pMOS transistor 104 connected in parallel to transistor 102 and an nMOS transistor 107 connected in parallel to transistor 106, each of which has a gate connected to the output of the delay circuit 108. Transistors 102 through 107 as combined constitute an inverter 109 for supplying an output signal through output signal line 110. Transistors 104 and 107 have a large channel width as compared to transistors 102 and 106, respectively. The delay circuit 108 is formed by, for example, an odd number of cascaded inverters.

Operation of the high-speed drive circuit of FIG. 1A will be described with reference to FIG. 1B. In an initial steady state, the input signal is at a low level, so that transistors 102, 103 and 107 are on and transistors 104, 105 and 106 are off. Hence, the output signal line 110 is at a high level. In a transient state, while the level of an input signal supplied through input signal line 101 rises, the delay circuit 108 maintains, for a predetermined period of time, its original output level which is the inverse of the level of the original input signal. When the input signal exceeds the threshold of the transistors, transistors 102 and 103 turn off and transistors 105 and 106 turn on while transistors 104 and 107 remain in their initial states. Hence, the output signal line 110 is driven to a low level by transistor 107 additionally to transistors 105 and 106 at a high speed.

Similarly, the inverter 109 operates at a high speed when the input signal falls from high to low. In short, the inverter 109 has a low logical threshold voltage when the input signal rises while has a high logical threshold voltage when the input falls.

As a result, if the high speed drive circuit as described above is used to detect a signal transmitted through a signal line having a high parasitic resistance and capacitance in which the level of a signal slowly changes, the signal transition is quickly detected to reduce or recover the delay of the signal transmission.

In the conventional high-speed drive circuit of FIG. 1A, since the delay circuit is formed by a plurality of cascaded inverters to have an inherent delay time, it cannot be used if the period of tile input signal is longer than the inherent delay time. Namely, the drive circuit cannot be operated at frequencies lower than a frequency determined by the delay time.

Moreover, since the level of the output signal immediately changes after the level of the input signal starts to change, the drive circuit suffers from a small noise margin.

FIG. 2A shows a different example of a conventional drive circuit having a large noise margin.

The drive circuit shown in FIG. 2A has an inverter 121 including pMOS transistors 112, 113 and 114 and nMOS transistors 115, 116 and 117 and having a similar configuration to that of inverter 109 of FIG. 1A, and an inverter 118 which receives the output signal 120 of inverter 121. Each of pMOS transistor 114 and nMOS transistor 117 of the inverter 121 has a large channel width and a gate connected to tile output of the inverter 118.

As shown in FIG. 2B, when an input signal supplied to the drive circuit of FIG. 2A changes its level, the threshold of inverter 121 varies to prevent the change of the level of the output signal 120. Hence, the level of the output signal at output signal line 119 changes after the level of the input signal sufficiently changes. Hence, the logical threshold voltage of the drive circuit is high when the level of the input signal rises while low when the level of the input signal falls.

As a result, the drive circuit of FIG. 2A is used in an input/output buffer subjected to a large noise to increase the noise margin of the circuit.

In the conventional drive circuit having a large noise margin as described above, the level of the output signal does not change until the level of the input signal sufficiently changes. Therefore, if the above drive circuit is used to drive a signal line having a high parasitic resistance and capacitance, propagation delay of signal increases.

Accordingly, a drive circuit is desired which has a large noise margin and operates in a wide frequency range, at a high speed even for a slow signal transition of an input signal.

SUMMARY OF THE INVENTION

In view of the foregoing, it is an object of the present invention to provide an improved drive circuit which can be used for an input signal having a large rise time and a wide frequency range.

Another object of the present invention is to provide an improved drive circuit which has a large noise margin and operate at a high speed even transition input signal.

A drive circuit according to the present invention includes first and second circuit sections each having an input connected to an input signal line. The first circuit section includes a first circuit portion responding to an input signal supplied through the input signal line and a second circuit portion delaying or decelerating a signal transition of the output of the first circuit section during at least an initial stage of the transient period of the input signal to generate a delayed output of the first circuit section. The second circuit section includes a third circuit portion responding to the input signal and a fourth circuit portion, responsive to the delayed output of the first circuit section, for accelerating a signal transition of the output of the third circuit portion.

Preferably, the drive circuit further comprises a third circuit section which receives the outputs of the first circuit section and the second circuit section to further accelerate the signal transition of the inputs of the first and the second circuit sections by charging or discharging the inputs of the first and the second circuit sections.

Preferably, the drive circuit further comprises, addition to the third circuit section, a fourth circuit section which breaks tile input signal line from the inputs of the first and second circuit sections during the transient period, for a quick charge or discharge by the third circuit section.

The drive circuit according to the present invention has a low logical threshold when an input signal rises while has a high logical threshold when an input signal falls, because the second circuit portion of the second circuit section is operated by the output of the first circuit section at the initial stage of the signal transition of the input signal to accelerate the signal transition of the third circuit portion for a high speed signal transmission. It can operate at an input signal of a large rise time and in a wide frequency range.

The above and other objects, features and advantages of the present invention will be more apparent from the following description.

BRIEF DESCRIPTION OF THE DRAWINGS

FIG. 2B is a timing chart of signals in operation of the drive circuit shown in FIG. 2A;

DESCRIPTION OF THE PREFERRED EMBODIMENTS

Figure 3:
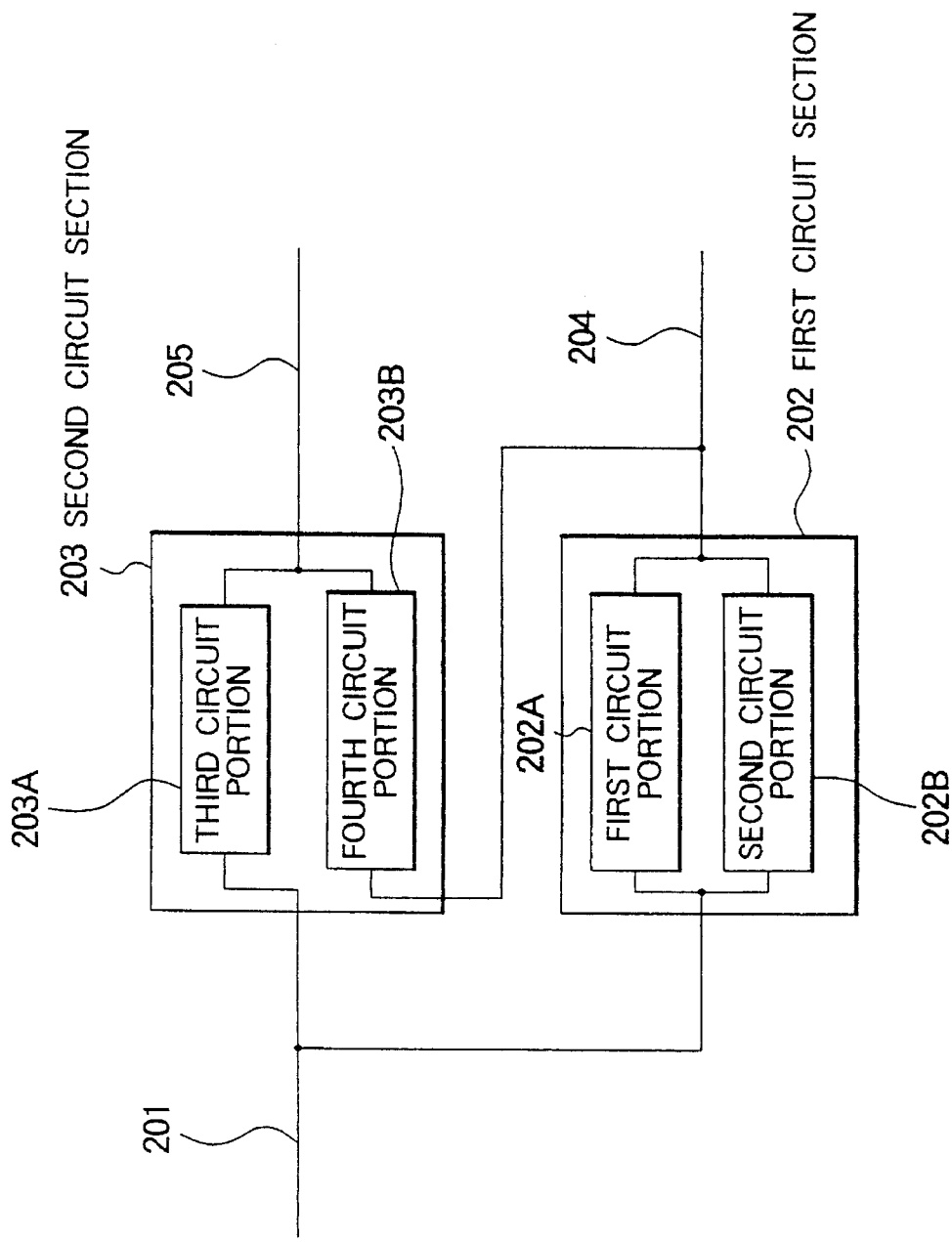
FIG. 3 is a block diagram showing a drive circuit according to a first embodiment of the present invention.

Referring to FIG. 3, there is shown a drive circuit according to a first embodiment of the present invention.

The drive circuit according to the present embodiment includes a first circuit section 202 and a second circuit section 203 both receiving an input signal through input signal line 201 to supply outputs through output signal lines 204 and 205, respectively.

The first circuit section 202 has a first circuit portion 202A and a second circuit portion 202B. The first circuit portion 202A detects a transient state of an input signal supplied through input signal line 201 to supply an output signal, while the second circuit portion delays the signal transition of the output of the first circuit portion during an initial stage of the signal transition of the input signal. Accordingly, the first circuit section 202 maintains a first output signal at a level before the transient state. The first output signal may be the same level as that of the input signal before the transition or a signal having a level which is the inverse of the input signal before the transition. After the transient state of the input signal, the first circuit section 202 supplies a second output signal responsive to the transition of the input signal.

The second circuit section 203 has a third circuit portion 203A and a fourth circuit portion 203B. The fourth circuit portion 203B receives the output of the first circuit section 202 for accelerating signal transition of the output of the third circuit portion 203A responding to the input signal. The second circuit section 203 changes its state at an initial stage of the signal transition of the input signal.

In place of a single input signal line 201, a pair of complementary signal lines may be employed as the inputs of the drive circuit. Similarly, each of output signal lines 204 and 205 may include a single or a plurality of signal lines which may be a pair of complementary signal lines.

In the drive circuit according to the present embodiment, first circuit section 202 detects a transient state of an input signal, supplies during the period of the transient state of the input signal a first output signal corresponding to the initial state of the input signal, and supplies after the transient state of the input signal a second output signal responsive to the change of the input signal. The second circuit section detects the transient state of the input signal and supplies an output signal immediately responsive to the signal transition of the input signal through the acceleration of the output signal by the fourth circuit portion. The output of the second circuit section 203 changes its state at an early stage of the signal transition, so that signal delay in the input signal can be recovered by the drive circuit.

The structure of the present embodiment solves the problems of a conventional high speed drive circuit that it cannot be used in cases where the delay of the input signal is excessively large, and that it cannot operate at frequencies lower than a frequency determined by the delay produced by the delay circuit. Namely, the drive circuit according to the present invention can be used even in case of a large rise time of an input signal. Also, it can operate at an arbitrary frequency, because no delay circuit having a fixed delay time is used.

Figure 4:
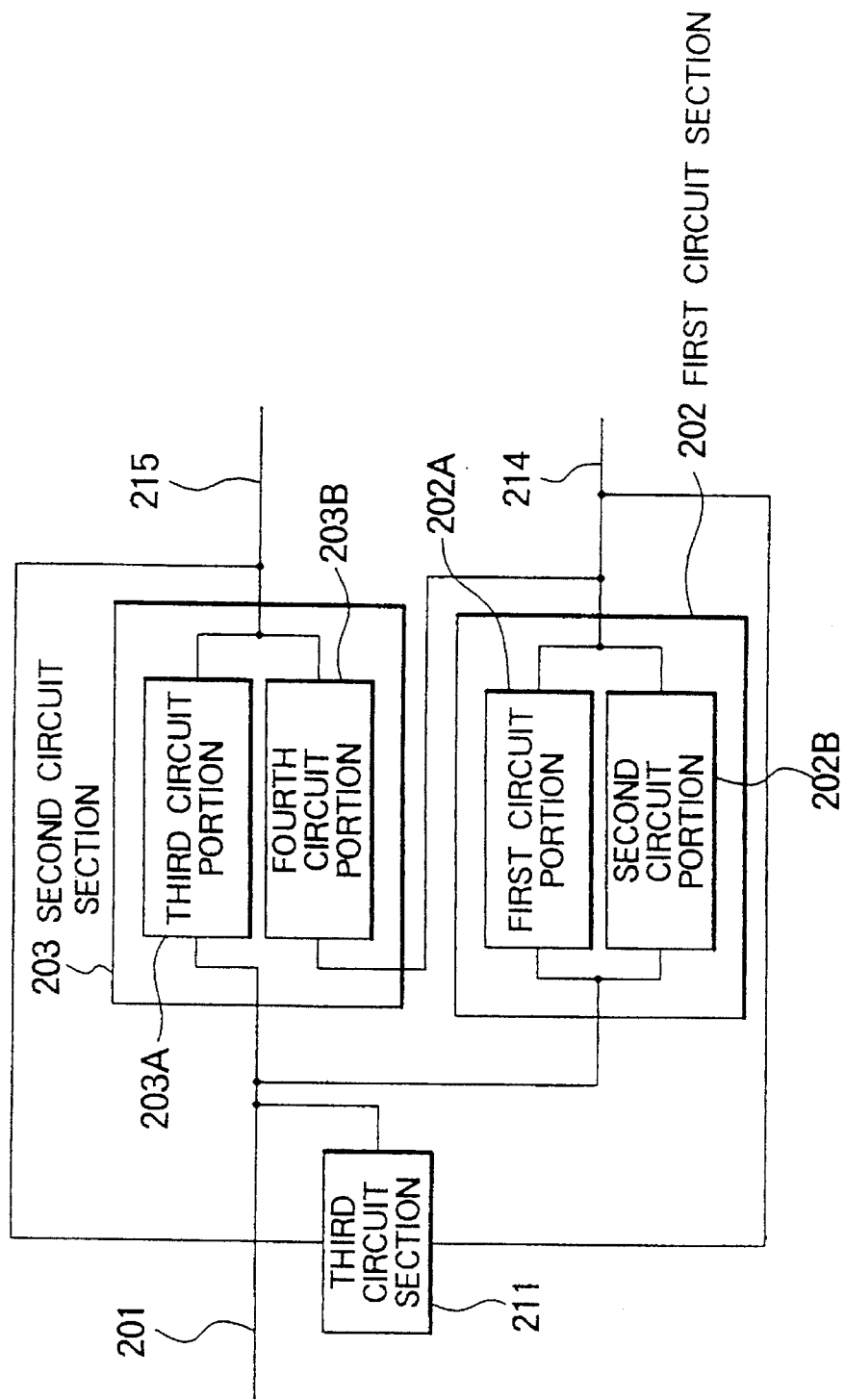
FIG. 4 is a block diagram showing a drive circuit according to a second embodiment of the present invention.

Referring to FIG. 4, there is shown a drive circuit according to a second embodiment of the present invention. The drive circuit includes a first circuit section 202 and a second circuit section 203 both similar to those of FIG. 3, and a third circuit section 211. The first circuit section 202 detects a transient state of an input signal supplied through input signal line 201, and supplies an output signal through signal line 214. During a period of the transient state of the input signal, the first circuit section 202 maintains the initial state of the output thereof and supplies an output signal responsive to the change of the input signal after the transient state.

The second circuit section 203 receives the input signal and the output of the first circuit section 202, and immediately supplies an output signal responsive to the change of the input signal.

The third circuit section 211 receives the outputs of the first and the second circuit sections 202 and 203 to charge or discharge input signal line 201 and stops the charge or discharge based on the outputs of the first circuit section 202 and the second circuit section 203. The third circuit section 211 functions for accelerating the speed of the change in the voltage at the input signal line 201.

In place of a single input signal line 201, a plurality of signal lines, for example, a pair of complementary signal lines may be used. Similarly, each of output signal lines 214 and 215 may include a single or a plurality of signal lines which may be a pair of complementary signal lines.

With the drive circuit according to the present embodiment, since not only a transient period of an input signal but also the direction of the change is detected by the outputs of the first and second circuit sections so as to operate the third circuit section 211 for accelerating the signal transition of the input signal, the drive circuit has a large noise margin and can recover the delay of the signal transition in the input signal.

Figure 5:
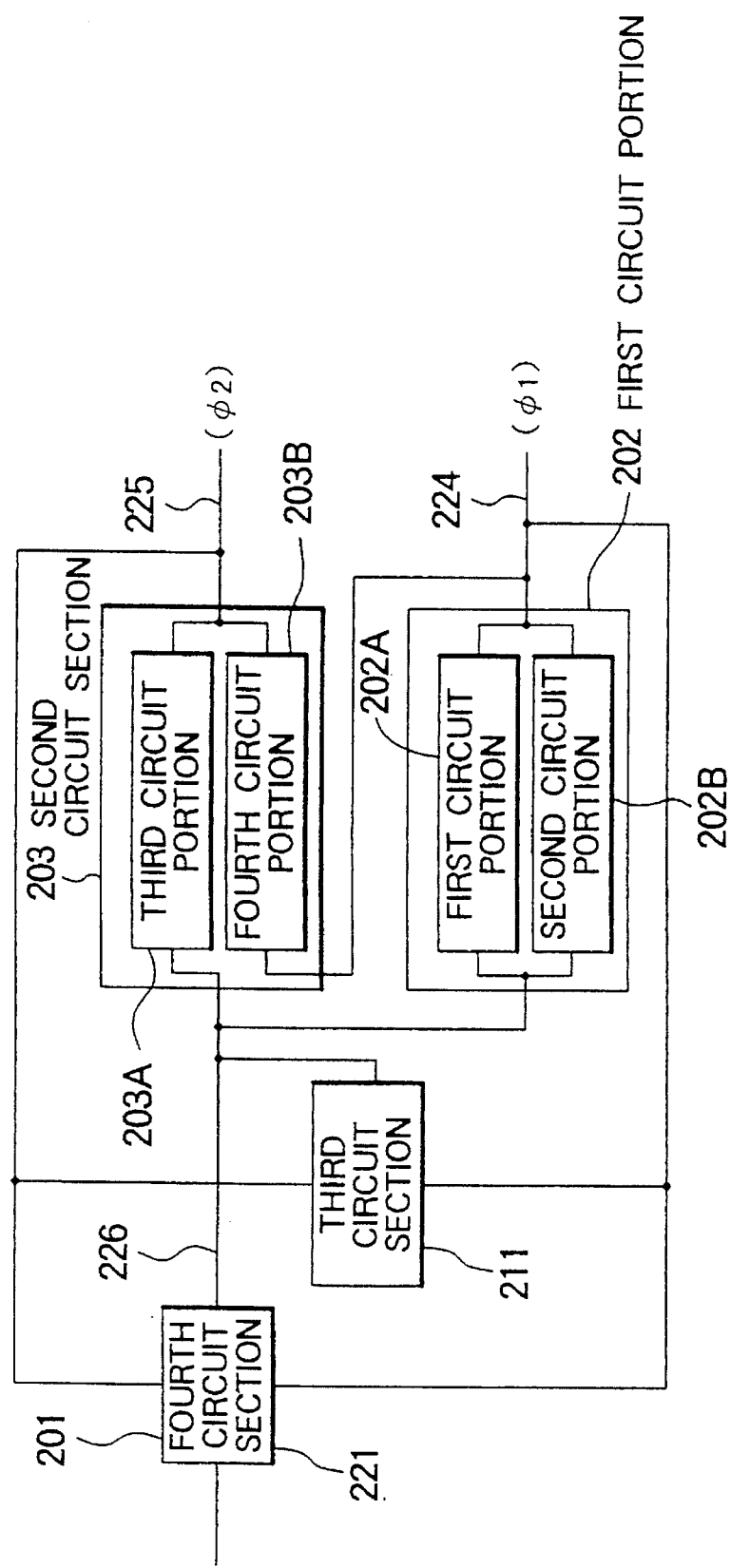
FIG. 5 is a block diagram showing a drive circuit according to a third embodiment of the present invention.

Referring to FIG. 5, there is shown a drive circuit according to a third embodiment of the present invention.

The drive circuit includes a first circuit section 202, a second circuit section 203, a third circuit section 211, and a fourth circuit section 221. The first through third circuit section 202, 203 and 211 are same as those in FIG. 4. Inputs of first and second circuit sections, i.e., signal node 226 is coupled by fourth circuit section 221 to the input signal line 201 at the steady state of the input signal and disconnected therefrom during a transient period of the input signal.

The first circuit section 202 detects a transient state of an input signal at signal node 226, and maintains the output signal before the transient state. After a period of the transient state of the input signal, the first circuit section 202 supplies an output responsive to the change of the input signal.

The second circuit section 203 receives the input signal at the signal node 226 and the output of the first circuit section 202 and supplies an output signal through output signal line 225 responsive to a slight change in the level of the input signal at the input signal line 201.

The third circuit section 211 detects the direction of the change in the voltage of the input signal to charge or discharge the signal node 226 and stops the charge or discharge based on the outputs of the first and second circuit sections 202 and 203. The third circuit section 211 functions for accelerating the speed of the change in the voltage at the signal node 226.

The fourth circuit section 221 detects a transient period of the input signal based on the output signals from the first circuit section 202 and from the second circuit section 203, and disconnects or breaks the signal node 226 from input signal line 201 during tile detected transient period so as to facilitate the signal transition at signal node 226.

Each of the input signal line 201 and output signal lines 224 and 225 may include a single or a plurality of signal lines which may be a pair of complementary signal lines.

With the drive circuit according to the present embodiment, since not only a transient period of an input signal but also the direction of signal transition is detected so as to operate the third circuit section 211 for accelerating the change of the input signal and to operate the fourth circuit section 221 for simultaneously breaking the signal node 226 from the input line 201, acceleration of the signal transition at signal node 206 can be operated more effectively, thereby further recovering the delay of the signal transition in the input signal.

Figure 6:
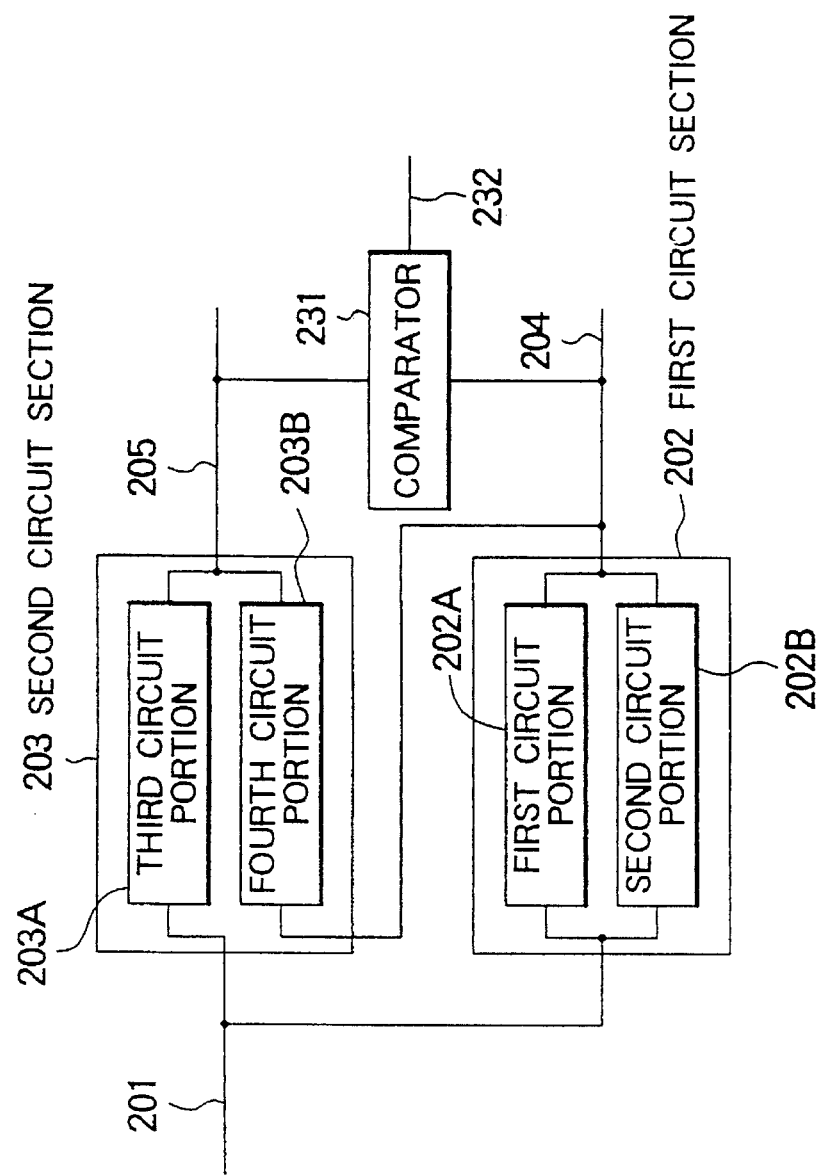
FIG. 6 is a block diagram showing a drive circuit according to a fourth embodiment of the present invention.

Referring to FIG. 6, there is shown a drive circuit according to a fourth embodiment of the present invention.

The drive circuit according to the present embodiment includes a first circuit section 202, a second circuit section 203, and a comparator section 231.

Namely, the drive circuit of the present embodiment includes a comparator section 231, additionally to the configuration of FIG. 3, for comparing the output of the first circuit section 202 with the output of the second circuit section 203 to supply an output signal representing the result of the comparison through signal line 232. The function of both the first circuit section 202 and the second circuit section 203 are same as those in FIG. 3. The output 232 of the comparator section 231 is set at "1" if the outputs of both the first circuit section 202 and the second circuit section 203 coincide with each other.

With the drive circuit according to the present embodiment, an output signal from the second circuit section 203, which changes at an initial stage of the transient period, is compared with an output signal from the first circuit section 202, which changes at the final stage of the transient period of the input signal. When both output signals finally coincide with each other, it is judged that processing performed by using the output of the second circuit section 203 at the initial stage of the signal transition is correct. If both output signals do not coincide with each other, it is judged that the output signal stays in a transient state or is incorrect in a steady state. Accordingly, it is possible to judge based on the output of the comparator section 231 whether the processing has been correctly performed by using the output signal of the second circuit section 203. If the output of the comparator is "0" in the following steady state, processing is recovered and re-processing follows accordingly.

Figure 7:
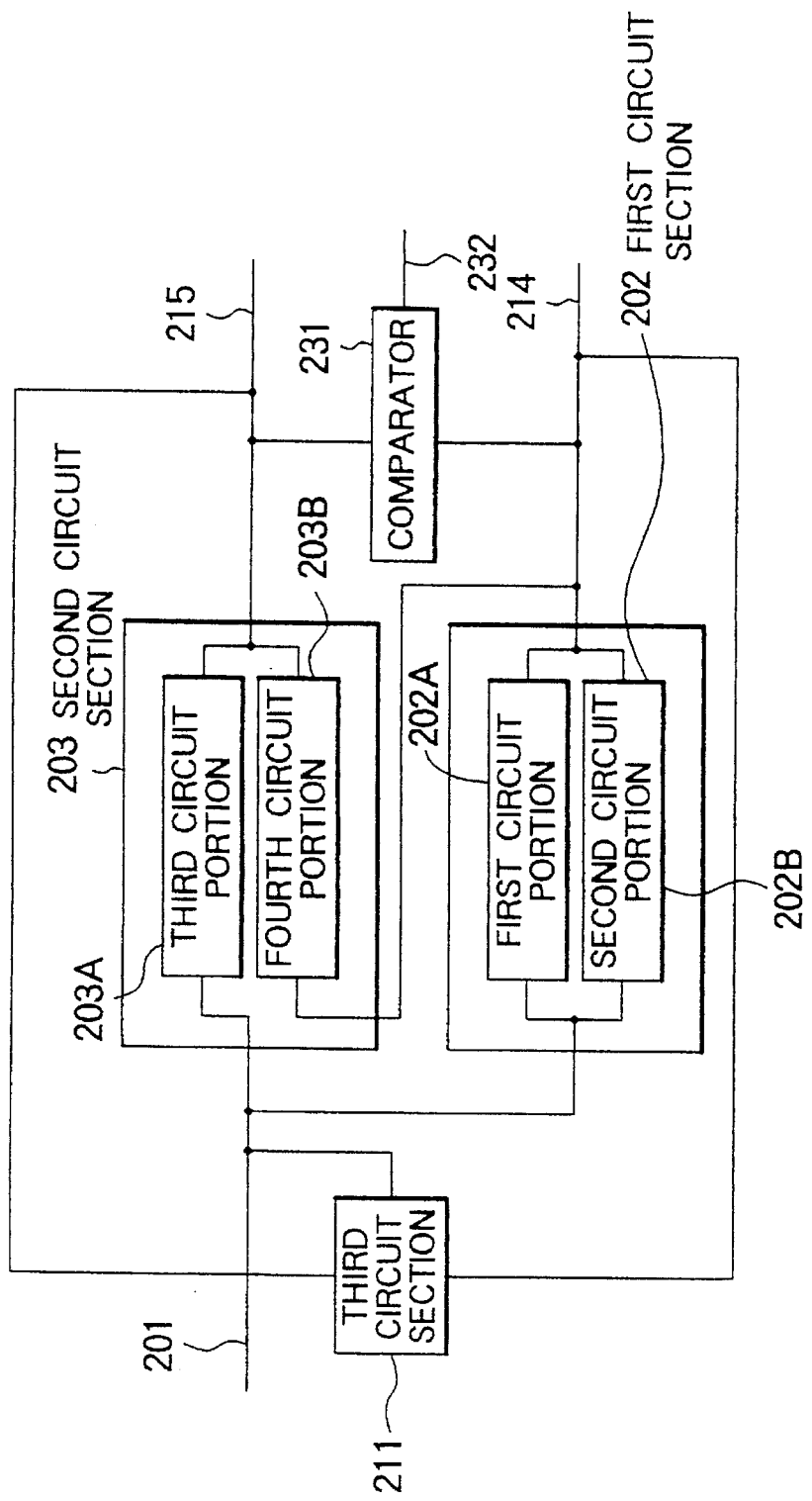
FIG. 7 is a block diagram showing a drive circuit according to a fifth embodiment of the present invention.

Referring to FIG. 7, there is shown a drive circuit according to a fifth embodiment of the present invention.

The drive circuit according to the present embodiment includes, addition to the drive circuit of FIG. 4, a comparator section 231. The comparator section 231 of FIG. 7 functions similarly to that of FIG. 6.

With the drive circuit according to the present embodiment, since the comparator section 231 is used to detect an error in output signal from the second circuit section 203, the determination for the correctness of the processing performed in the drive circuit can be made quickly similarly to the drive circuit of FIG. 6. As a result, it is possible to recover the drive circuit from an erroneous state to a normal state after the detection of the erroneous state so as to perform re-processing.

Figure 8:
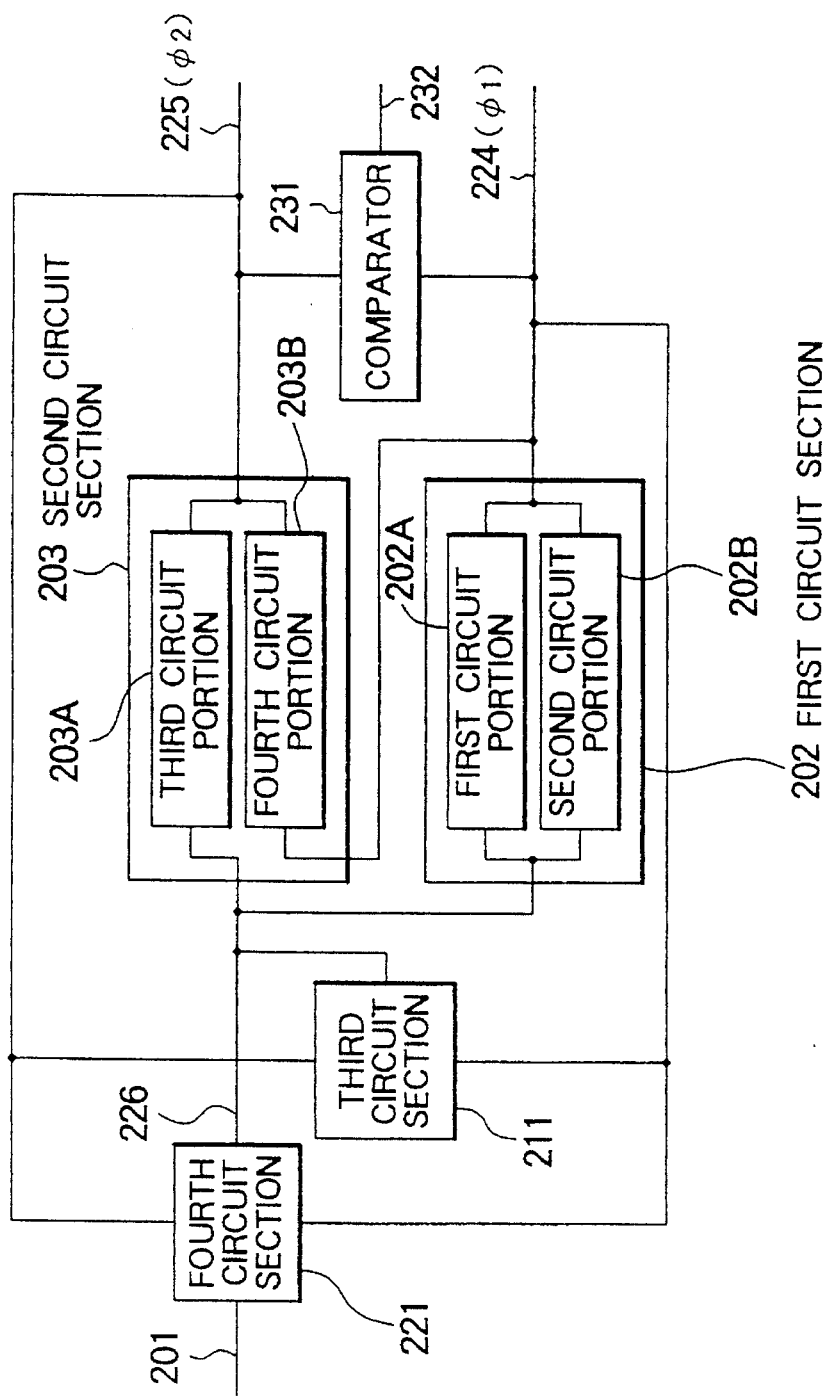
FIG. 8 is a block diagram showing a drive circuit according to a sixth embodiment of the present invention.

Referring to FIG. 8, there is shown a drive circuit according to a sixth embodiment of the present invention.

The drive circuit according to the present invention includes, addition to the drive circuit of FIG. 5, a comparator section 231 similarly to the drive circuit of FIG. 7. The function of the comparator section 231 is similar to that of FIG. 7.

Next, the detail of the operation of the drive circuits according to the present invention will be described.

Figure 9:
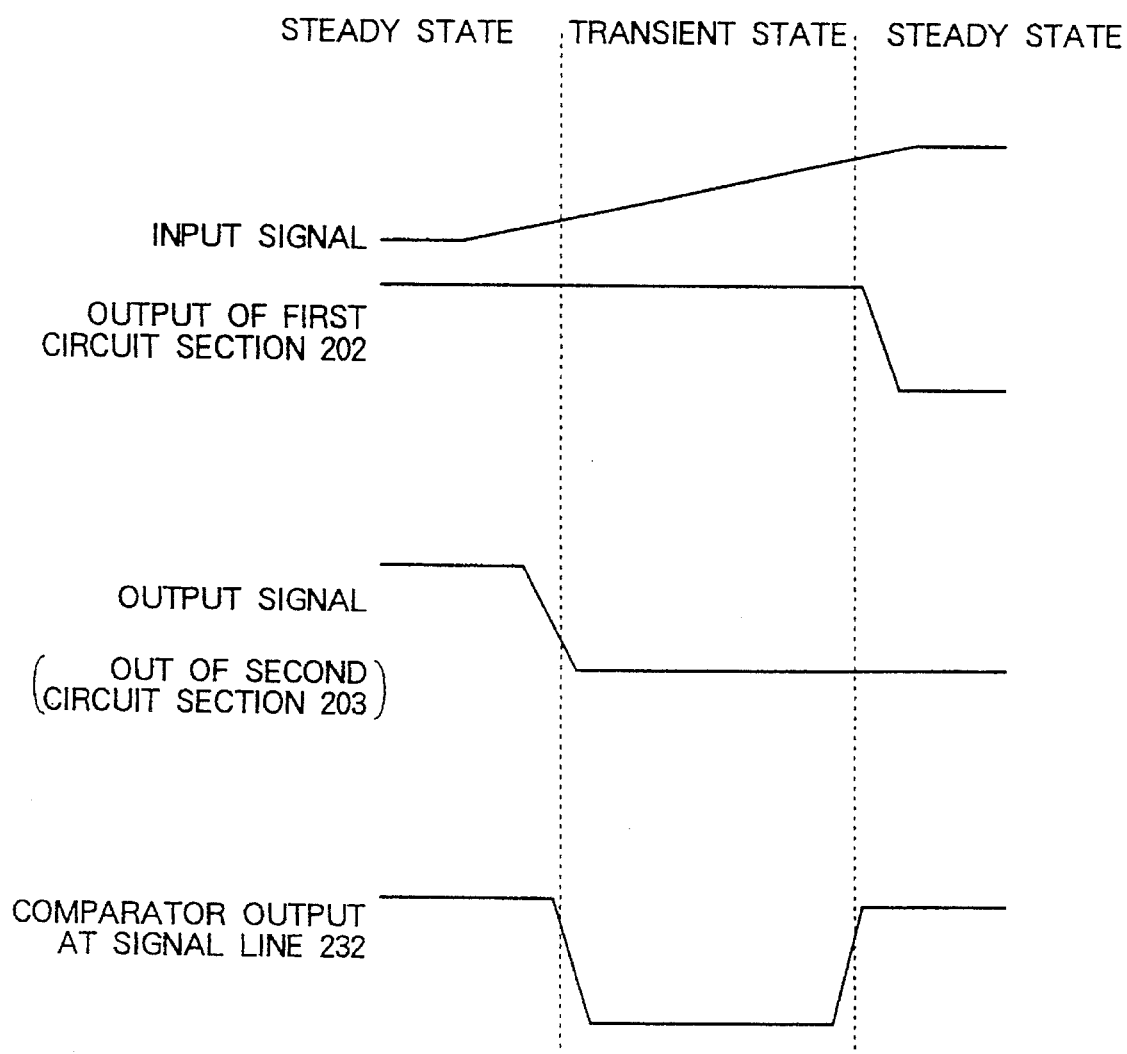
FIG. 9 is a timing chart of signals in operation of the drive circuits of FIGS. 3 and 6.

Referring to FIG. 9, there is shown a timing chart of signals in operation of the drive circuit according to the first and fourth embodiments. FIG. 9 exemplarily shows a situation in which the level of an input signal rises from "0" to "1".

In the output signal of an input/output buffer for driving a highly capacitive load, a bus drive circuit, or a circuit for driving a signal line having a high parasitic resistance and capacitance, the rise time or fall time is large, as shown by the top curve in FIG. 9, resulting in an increased delay time of signal transition.

During the transient period, the first circuit section 202 maintains the output signal at a high level in accordance with the input signal supplied before the transient period. At the final stage of the transient period, the output of the first circuit section 202 falls responsive to the signal transition of the input signal. The second circuit section 203 supplies an output signal of a high level before the signal transition, and falls down at the initial stage of the transient period. The output 204 of the first circuit section 202 controls the fourth circuit portion 203B of the second circuit section 203 for accelerating the signal transition of the output 205 of the second circuit section 203.

Accordingly, the logical threshold voltage of the second circuit section 203 of FIG. 3 is set at a low level when the input signal rises and set at a high level when the input signal circuit falls, so as to obtain a reduced time for response of the second circuit section 203.

Referring back to FIG. 6, the comparator section 231 is provided to compare the output 204 from the first circuit section 202 with the output 205 from the second circuit section 203. Hence, it is possible to confirm whether the processing is correctly performed by using the signal output through output signal line 232, as shown by the bottom curve in FIG. 9. In the circuit of FIG. 6, if the output signal supplied through output signal line 232 rises after the transient period as shown in FIG. 9, it verifies that the processing is correctly performed. When the signal supplied through output signal line 232 is at a low level after the transient period, it is informed that the processing performed by using the output signal supplied through output signal line 205 is erroneously performed due to, for example, a noise. In this case, the processing must be performed again. The logical level itself of the signal supplied through output signal line 232 may be inverted.

Figure 10:
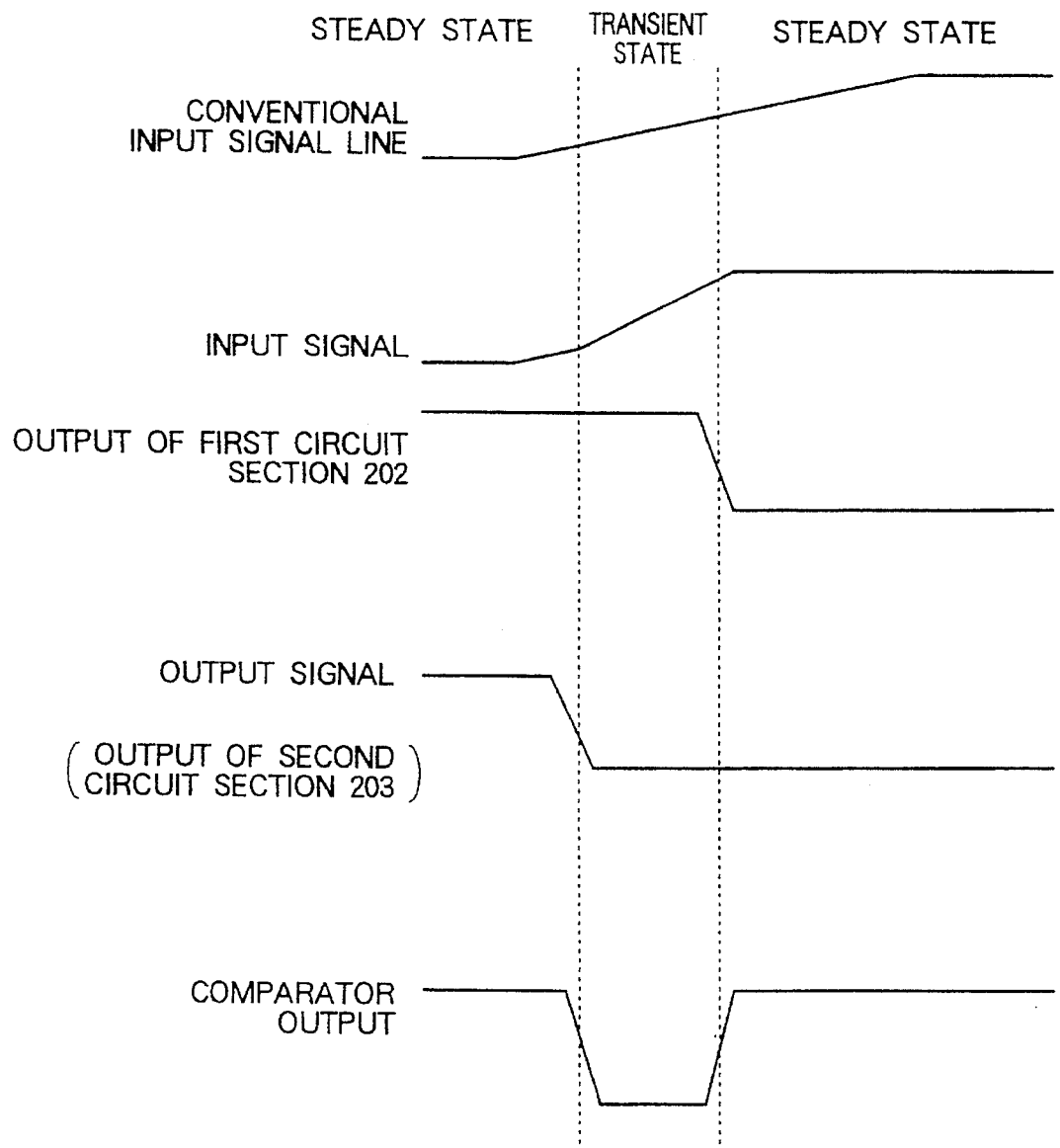
FIG. 10 is a timing chart of signals in operation of the drive circuits of FIGS. 4 and 7.

Referring to FIG. 10, there is shown a timing chart in operation of the drive circuit according to the second and fifth embodiments.

FIG. 10 exemplarily shows a situation in which the level of an input signal rises from "0" to "1". In the output signal of an input/output buffer, a bus driver, or a drive circuit for driving a signal line having a high resistance and capacitance, the rise time or fall time is large as shown by the top curve in FIG. 10, resulting in an increased delay time in a conventional drive circuit.

During the transient period, the first circuit section 202 maintains tile output signal at a high level in accordance with the input signal supplied before the transient period. At the end of the transient period, the output of the first circuit section 202 falls responsive to the signal transition of the input signal. The second circuit section 205 supplies an output signal of a high level at an initial steady state, and falls down at the initial stage of the transient period. The direction of the signal transition of the input signal, which is necessary to operate the second circuit portion of the second circuit section for acceleration of the signal transition of the first circuit portion, is supplied by the first circuit section 202.

In response to the signal at output signal line 204, the third circuit section 211 charges or discharges input signal line 201 during the transient period to accelerate the signal transition at input signal line 201, as shown by the second top curve in FIG. 10. As a result, it is possible to recover the delay of the signal transition while providing a larger noise margin as compared to a conventional drive circuit, in which the level of the output signal changes in response to a slight change in the input signal resulting in a decreased noise margin.

Referring back to FIG. 7, the comparator section 231 is provided to compare the output from the first circuit section 202 with the output from the second circuit section 203. Hence, it is possible to confirm whether the processing is correctly performed by using the output signal supplied through output signal line 215. In the circuit of FIG. 7, if the signal output through output signal line 232 rises after the transient period as shown by the bottom curve in FIG. 10, it means that the processing is correctly performed. When the signal supplied through output signal line 232 remains at a low level after the transient period, it means that the processing performed by using the output signal supplied through output signal line 205 is erroneously performed. In this case, the processing must be performed again. The logical level itself of the signal supplied through output signal line 232 may be inverted.

Figure 11:
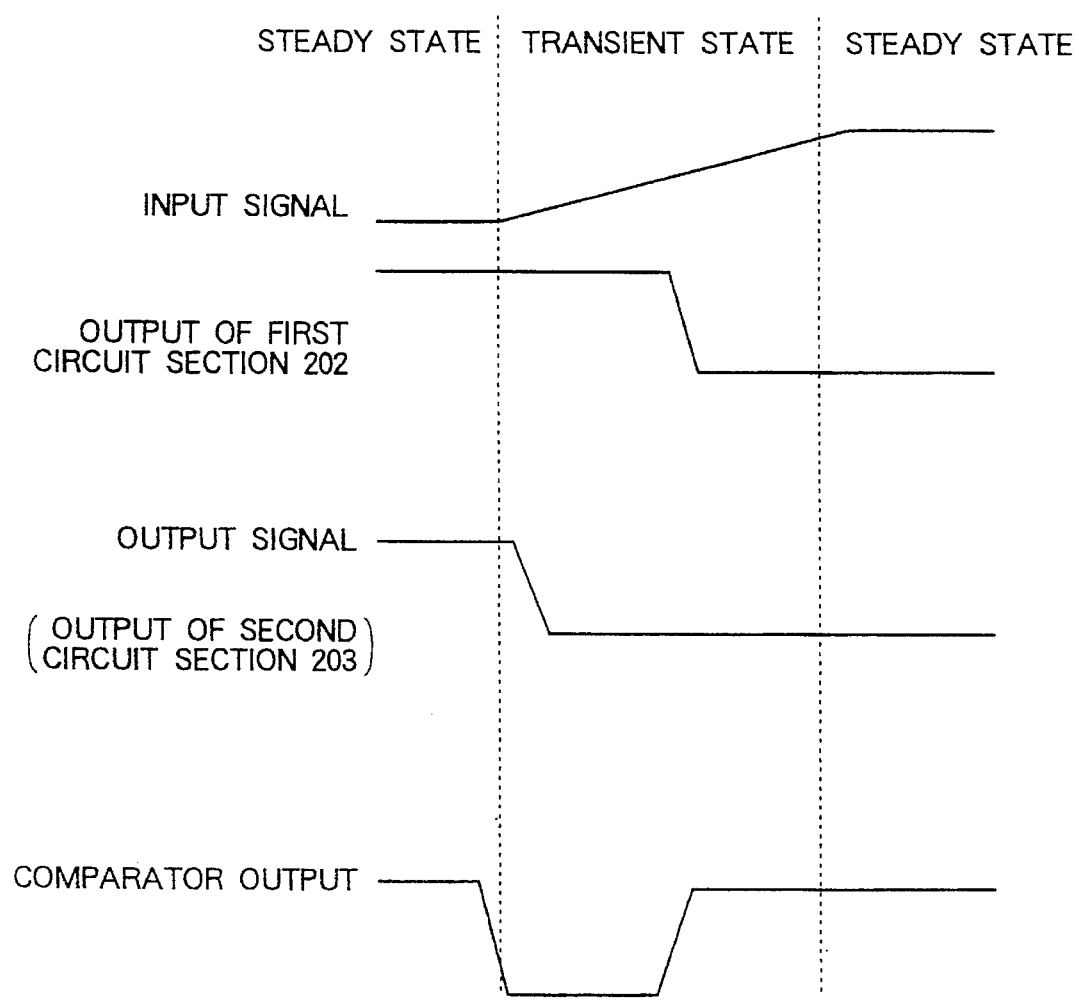
FIG. 11 is a timing chart of signals in operation of the drive circuits of FIGS. 5 and 8.

Referring to FIG. 11, there is shown a timing chart of signals in operation of the drive circuit according to the third and sixth embodiments.

FIG. 11 exemplarily shows a situation in which the level of an input signal supplied through input signal line 201 rises from "0" to "1". In the output of an input/output of bus buffer etc., the signal has a moderate slope as shown in FIG. 11, resulting in an increased delay time in signal transmission of the input signal.

Figure 1A:
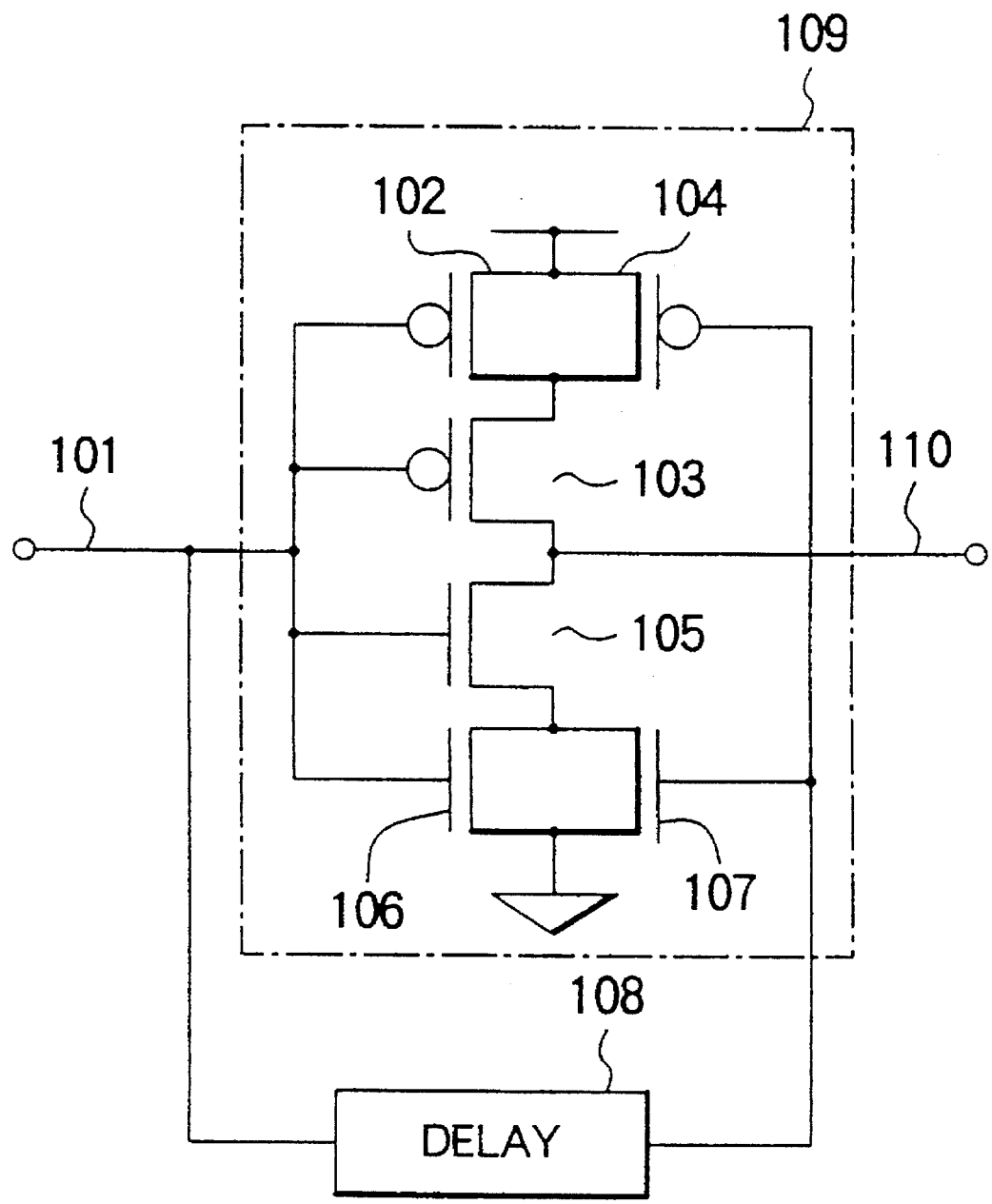
FIG. 1A is a circuit diagram showing a conventional drive circuit.
Figure 1B:
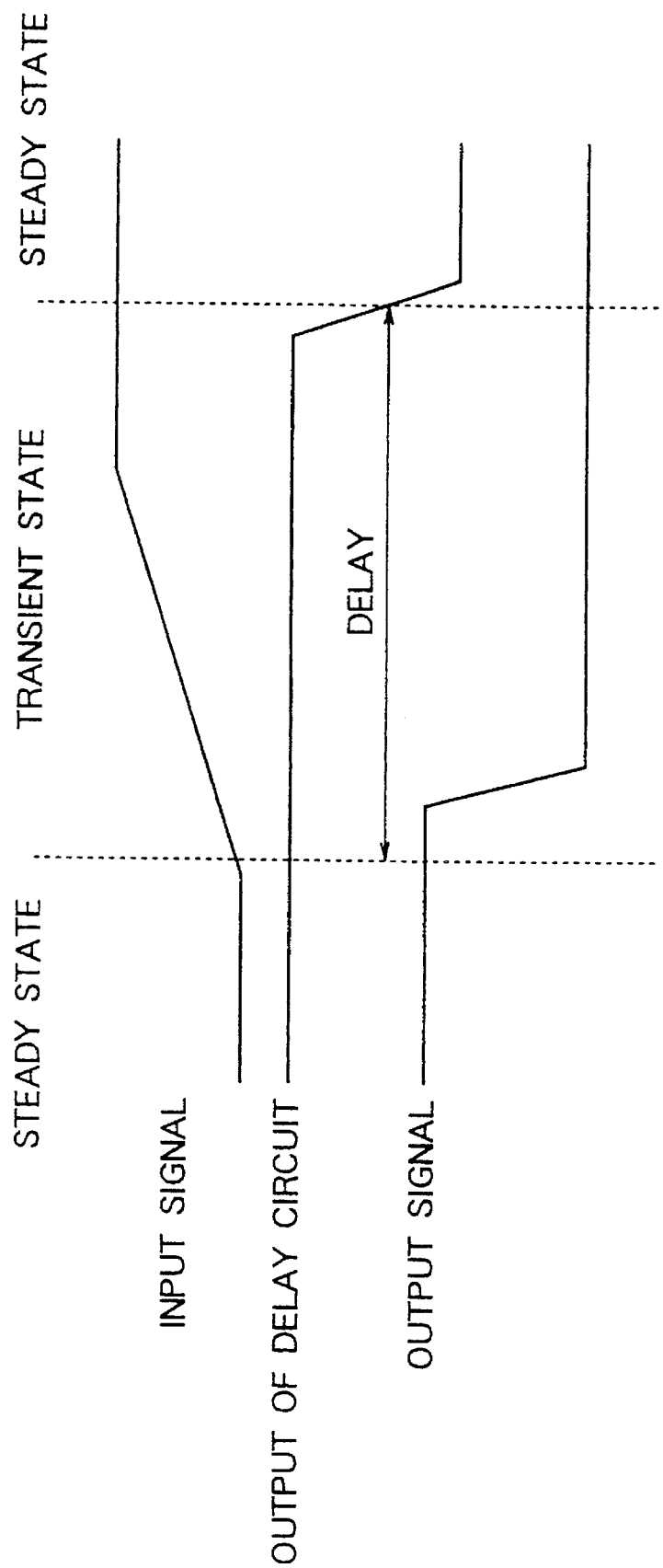
FIG. 1B is a timing chart of signals in operation of the drive circuit shown in FIG. 1A.

In response to the signal at output signal line 224, the third circuit section 211 charges signal node 226 to accelerate the rise of the signal node 226. Simultaneously, the fourth circuit section 221 breaks the connection between input signal line 201 and signal node 226 so that a large parasitic capacitance coupled to input signal line 201 is separated from the signal node 226. The signal node 226 can be charged to rise quickly. As a result, it is possible to further recover the delay of the signal transition while providing a larger noise margin as compared to the conventional drive circuit of FIG. 1. The comparator section 231 functions as those in FIGS. 6 and 7.

Figure 12:
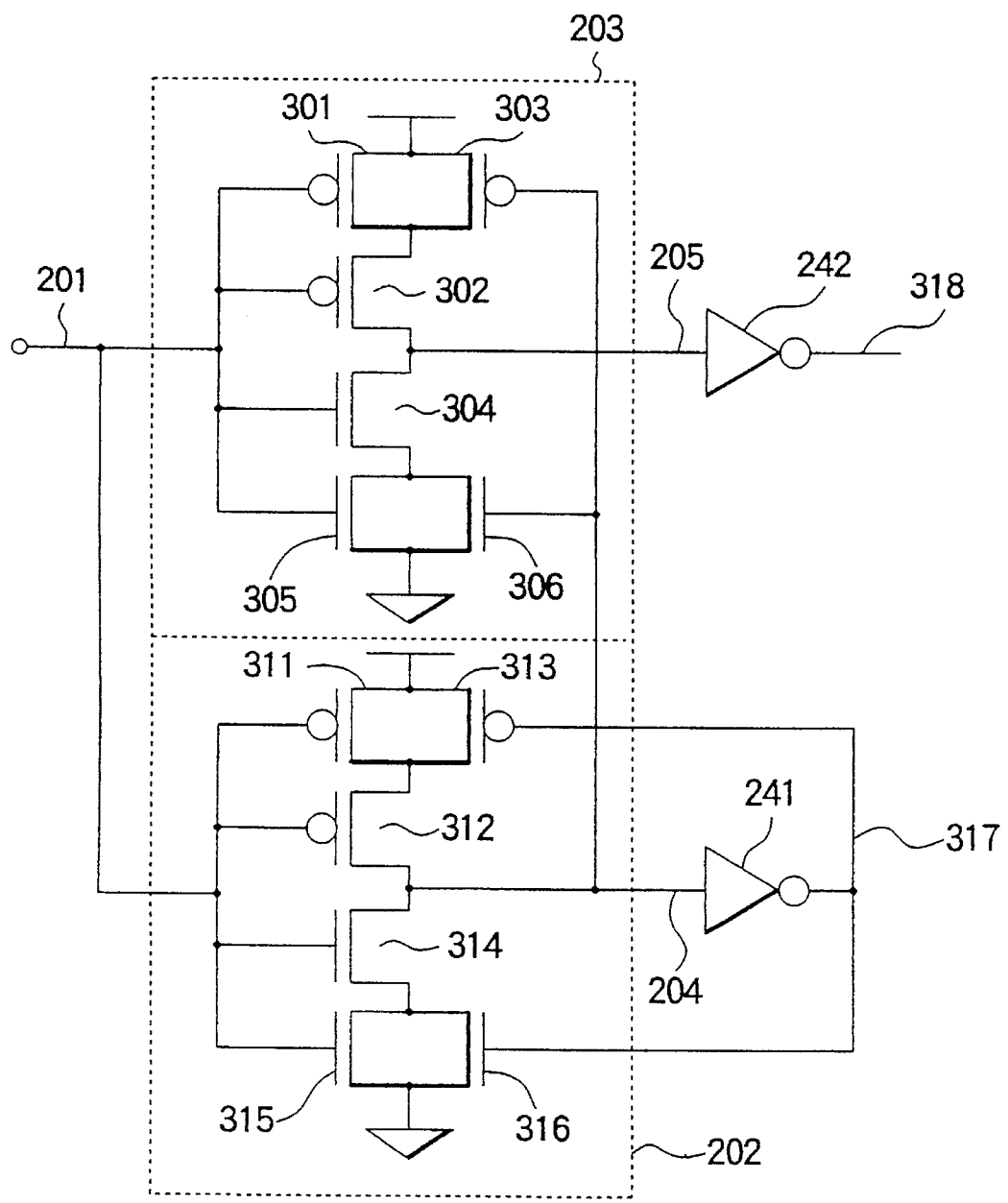
FIG. 12 is a circuit diagram showing a practical example of the drive circuit of FIG. 3.

Referring to FIG. 12, there is shown a circuit diagram of the detail of a drive circuit implementing the function of the first embodiment. The drive circuit includes inverters 241 and 242 receiving the outputs of the first circuit section 202 and second circuit section 203, respectively, addition to the circuit of FIG. 3.

The first circuit section 203 of the drive circuit has a first circuit portion including serial pMOS transistors 311 and 312 each having a gate connected to input signal line 201 and serial nMOS transistors 314 and 315 each having a gate connected to input signal line 201 and a second circuit portion including a pMOS transistors 313 and an nMOS transistor 316 each having a gate for receiving through signal line 317 a signal which is obtained by inverting the signal at signal line 204. The pMOS transistor 313 and nMOS transistor 316 are connected in parallel to transistors 311 and 315, respectively. Each of the p-channel transistor 313 and n-channel transistor 316 has a large channel width as compared to those of transistors 311, 312, 314 and 315.

The second circuit section 203 of the drive circuit has a third circuit portion including serial pMOS transistors 301 and 302 each having a gate connected to input signal line 201 and nMOS transistors 304 and 305 each having a gate connected to input signal line 201, and a fourth circuit portion including a pMOS transistor 303 and an nMOS transistor 306 each having a gate for receiving a signal supplied from the first circuit section 202 through signal line 204. The pMOS transistor 303 and nMOS transistor 306 are connected in parallel to transistors 301 and 305, respectively. Each of the p-channel transistor 303 and n-channel transistor 306 has a large channel width as compared to those of transistors 301, 302, 304 and 305.

Figure 2A:
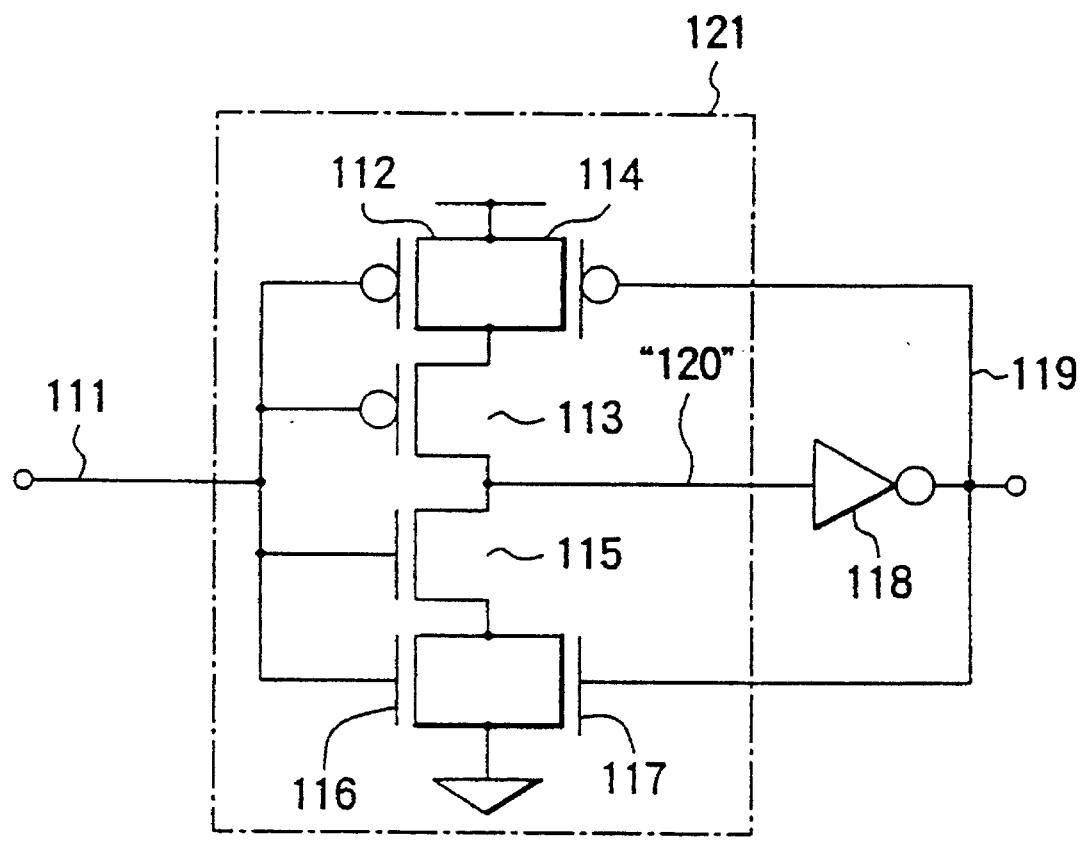
FIG. 2A is a circuit diagram showing another conventional drive circuit.

The first circuit section 202 has different logical thresholds depending on the direction of the signal transition of the input signal, which is similar to the conventional circuit of FIG. 2A.

Namely, the logical threshold of the first circuit section is high in a rise time of the input signal while low in a fall time of the input signal.

In operation, at the final stage of the transient period of the input signal, the output signal of the first circuit section 202 supplied through signal line 204 changes its level. However, the level at signal line 204 is substantially maintained during the transition period, at the original level before the transient period due to the small size of the transistors 311 and 315.

By utilizing the function of the first circuit section 202, the logical threshold voltage of the second circuit section 203 is different between a rise time and a fall time of the input signal. The situation will be described in which the level of the signal supplied to input signal line 201, for example, rises from 0 to 1.

Since signal line 204 is maintained substantially at a high level during a transient period of the input signal rising from low to high, transistor 306 remains in an ON state to thereby discharge the output signal line 205 together with transistors 305 and 306 which respond to the signal transition of the input signal at the threshold thereof. Hence, output signal line 205 can be discharged at a high speed to respond to the signal transition of the input signal, thereby falling at the initial stage of the transient period.

Namely, when input signal slightly rises, the output signal at output signal line 205 immediately falls. The drive circuit operates in a similar way when the input signal falls from "1" to "10". Namely, when the level of the input signal slightly falls from a high level toward a low level, the level at output signal line 205 immediately rises to a high level. Accordingly, if the drive circuit is used to receive a signal from a signal line in which the level of a signal changes slowly, the change of the signal is quickly detected to recover the delay of the signal transmission.

Figure 13:
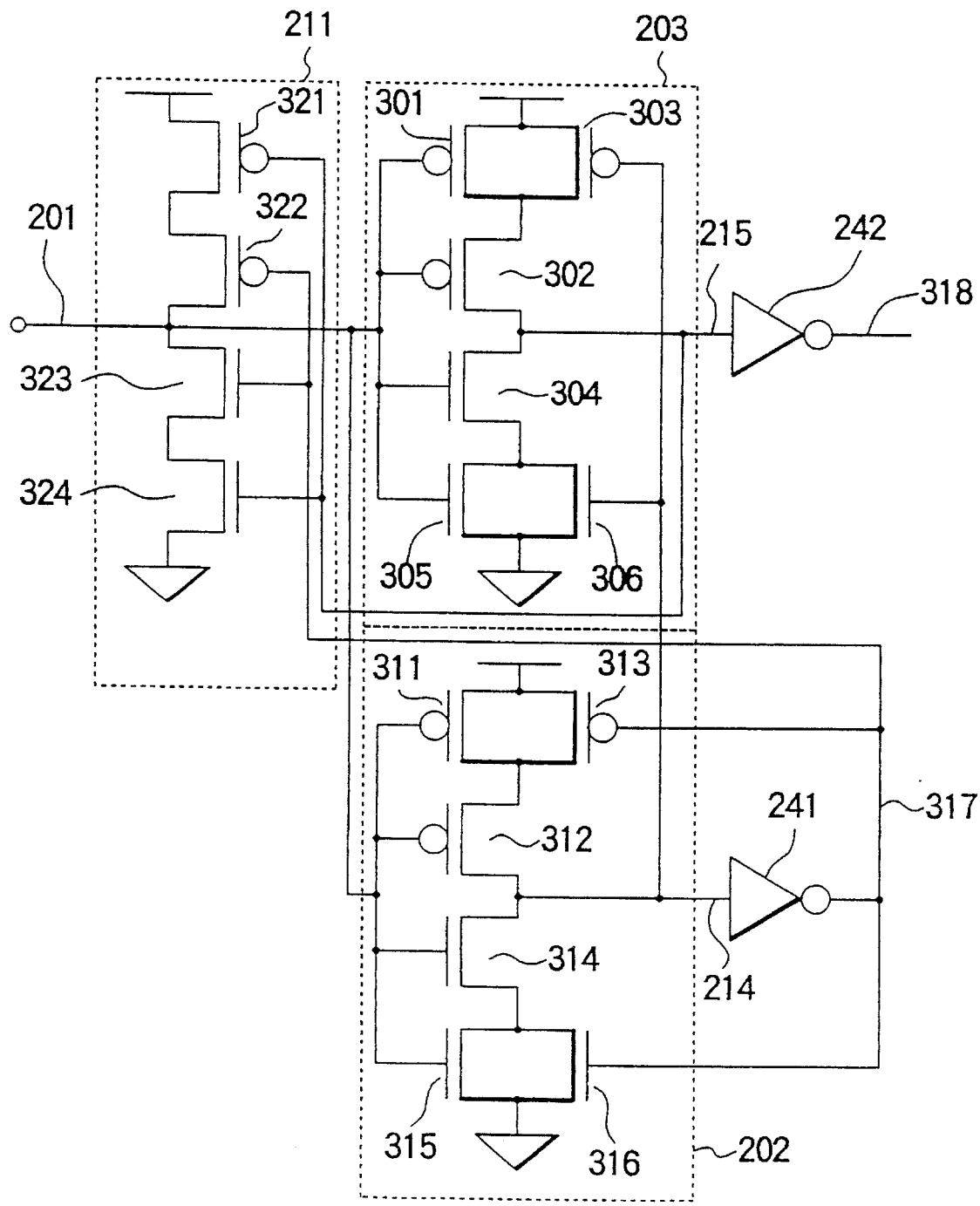
FIG. 13 is a circuit diagram showing a practical example of the drive circuit of FIG. 4.

FIG. 13 is a circuit diagram showing, similarly to FIG. 12, the detail of an example of the drive circuit according to the second embodiment similarly to FIG. 12. The drive circuit includes first, second and third circuit sections 202, 203, and 211 each connected to input signal line 201. The configurations of circuit sections 202 and 203 are same as those of circuit section 202 and 203 of FIG. 12.

The third circuit section 211 includes a p-channel transistor 321 and an n-channel transistor 324 each having a gate connected to signal line 215 which is the output of the second circuit section 203. The third circuit section 211 further includes a p-channel transistor 322 and an n-channel transistor 323 each having a gate connected to signal line 317 which is the output of the inverter 241 receiving the output of the first circuit section 202. P-channel transistors 321 and 322 are serially connected between a high potential line and input signal line 201 while n-channel transistors 323 and 324 are serially connected between a low potential line and input signal line 201.

Now, a situation will be considered in operation in which the level of the input signal rises from a low level to a high level in the drive circuit of FIG. 13.

During an initial stage of a transient period, p-channel transistor 322 and n-channel transistor 323 of the third circuit section 211 are maintained in an on state and an off state, respectively. The output of the second circuit section 203 falls to a low level at the initial stage of the transient period, so that the transistors 321 and 324 turn on and off, respectively. Accordingly, transistors 321 and 322 of the third circuit section 211 drive the input signal line 201 to a high level.

Therefore, if the drive circuit of FIG. 13 is used to drive a signal line in which the level of an input signal changes in a large rise time, the change of the signal is accelerated to recover the propagation delay. The drive circuit operates in a similar way when the level of the input signal falls from a high level to a low level.

Figure 14:
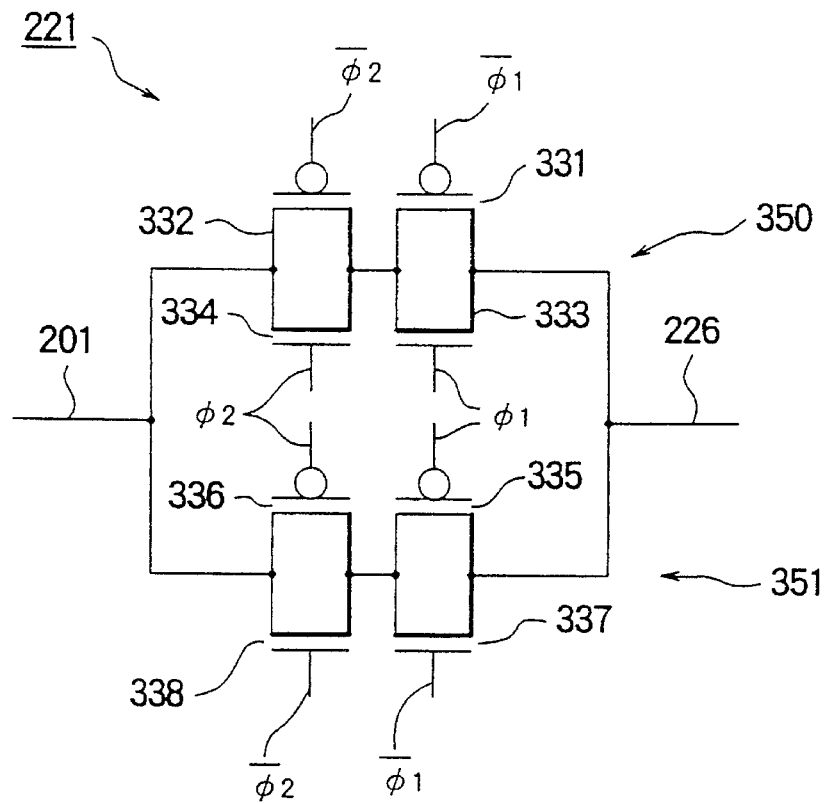
FIG. 14 is a circuit diagram showing a practical example of the fourth circuit section shown in FIGS. 5 and 8.

Referring to FIG. 14, there is shown the detail of an example of the fourth circuit section 221 as shown in FIGS. 5 and 8. The fourth circuit section 221 is comprised of two branches 350 and 351 each having a serial p-channel transistors 331 and 332 (335 and 336) and a serial n-channel transistors 333 and 334 (337 and 338) connected parallel to each other. Each of the first n-channel transistor 333 of the first branch 350 and p-channel transistor 335 of the second branch 351 has a gate receiving the output Φ1 of the first circuit section 202, while each of the second n-channel transistor 334 of the first branch 350 and the second p-channel transistor 336 of the second branch 351 has a gate receiving the output Φ2 of the second circuit section 203. Each of the first p-channel transistors 331 of the first branch 350 and the first n-channel transistors 337 of the second branch 351 has a gate receiving a control signal $\overline{\Phi 1}$ which is the inversion of the output of the first circuit section 202. Each of the second p-channel transistor 332 of the first branch 350 and the second n-channel transistor 338 of the second branch 351 has a gate receiving a control signal $\overline{\Phi 2}$ which is the inversion of the output of the second circuit section 203. The third circuit section 221 break the connection between signal line 201 and signal node 226 during the transient period of the input signal supplied through the input signal line 201.

Figure 15:
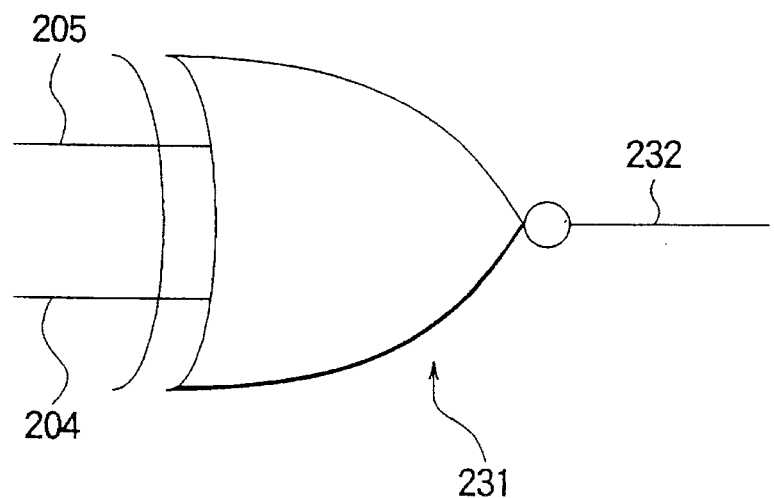
FIG. 15 is a circuit diagram showing a practical example of X0R gate shown in FIGS. 6, 7 and 8.

Referring to FIG. 15, there is shown an example of the comparator section 231 shown in FIGS. 6, 7 and 8. The comparator section 231 is implemented by an exclusive NOR gate which outputs a high-level signal only when signals on signal lines 204 and 205 coincide with each other. Alternatively, the comparator section 231 may be formed by an exclusive OR gate.

Figure 16A:
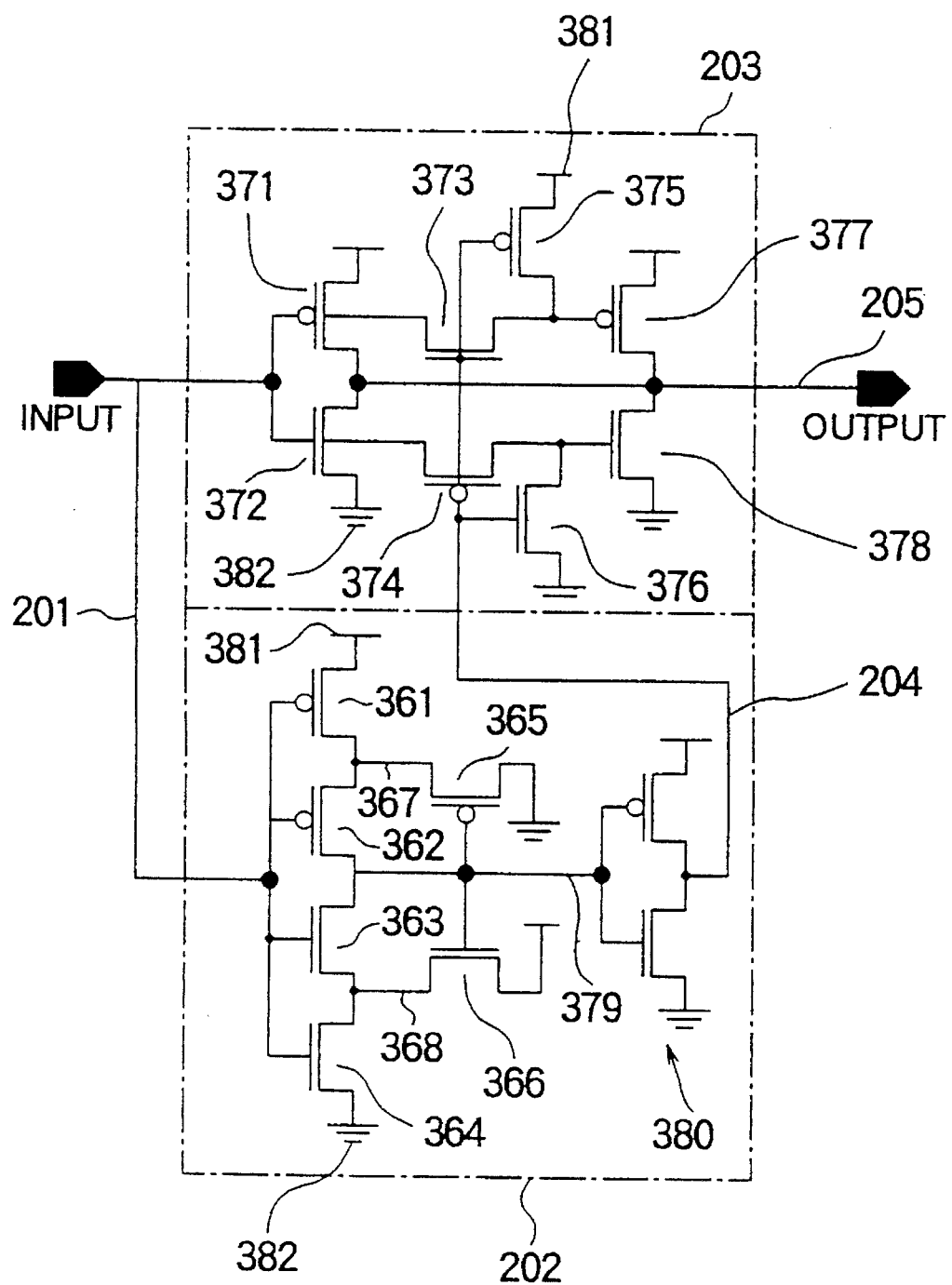
FIG. 16A is a circuit diagram showing another practical example of the drive circuit shown in FIG. 3.

Referring to FIG. 16A, another practical example of the drive circuit of FIG. 3 is shown.

The first circuit section 202 has a first circuit portion implemented by a first inverter including serial p-channel transistors 361 and 362 and serial n-channel transistor 363 and 364, which are connected in series between a high potential line 381 and a low potential line 382 and a second inverter 380 receiving the output 379 of the first inverter. The first circuit section 202 further includes a second circuit portion implemented by a p-channel transistor 365 connected between a node 367 connecting the serial p-channel transistors 361 and 362, and an n-channel transistor 366 connected between a node 368 connecting the serial n-channel transistors 363 and 364 and the high potential line 381.

Each of the p-channel transistor 365 and n-channel transistor 366 has a gate receiving the output 379 of the first inverter.

The second circuit section 203 has a third circuit portion implemented by an inverter including a p-channel transistor 371 and an n-channel transistor 372 each having a gate receiving an input signal, and a fourth circuit portion including transistors 373 through 376 driven by the input signal and the output 204 of the first circuit section 202, namely, output of the inverter 380. Configuration of the fourth circuit portion is such that: p-channel transistor 377 having a large channel width is connected between the high potential line 381 and the output signal line 205, an n-channel transistor having a large channel width is connected between the output signal line 205 and the low potential line 382; an n-channel transistor 373 having a gate receiving the output 379 of the inverter 380 is connected between the input signal line 201 and the gate of p-channel transistor 377; a p-channel transistor 374 having a gate receiving the output 204 of the first circuit section 202 is connected between the input signal line 201 and the gate of n-channel transistor 378; a p-channel transistor 375 and an n-channel transistor 376 are connected between the high potential line 381 and the gate of transistor 377 and between the low potential line 382 and the gate of the transistor 378, respectively.

The ratio of the channel width of the transistor 377 or 378 to that of the transistor 371 or 372 is designed at, for example, 20:1.

When the input signal line 201 rises during a transient period, the output 204 of the inverter 380 remains low for the transient period due to the n-channel transistor preventing the signal transition of the signal node 379 by maintaining the signal node 368 at a high potential, because the signal node 379 still remains at a high level. The low-level output 204 keeps the p-channel transistors 374 and 375 on during the initial stage of the signal transition. P-channel transistor 374 transmits the high-level input signal to the gate of n-channel transistor 378 to turn the same on, thereby driving the output signal line 205 to a low level at a high-speed.

At the final of the transient period, the output 204 of the first circuit section 202 rises at a high-level to turn p-channel transistor 374 and n-channel transistor 373 off and on, respectively. Accordingly, next input signal transition of the input signal falling to a low level is transmitted to p-channel transistor 377 at an initial stage of the transient period to thereby charge the output signal line 205 at a high speed.

Figure 16B:
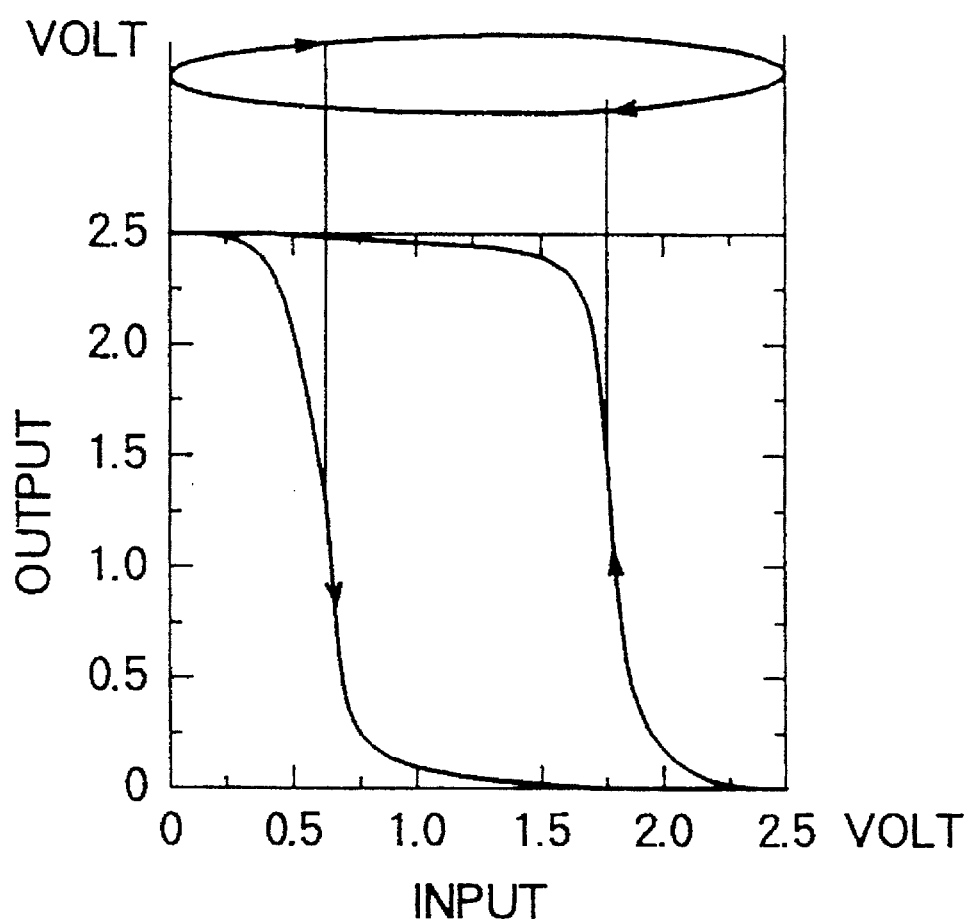
FIG. 16B is a graph showing logical threshold of the drive circuit shown in FIG. 16A.

Referring to FIG. 16B, operation of the drive circuit of FIG. 16A is demonstrated. The logical threshold voltage of the drive circuit is high (1.8 v) in a fall time and low (0.7 v) in a rise time of the input signal, thereby recoverring a signal delay of the input line.

Figure 17:
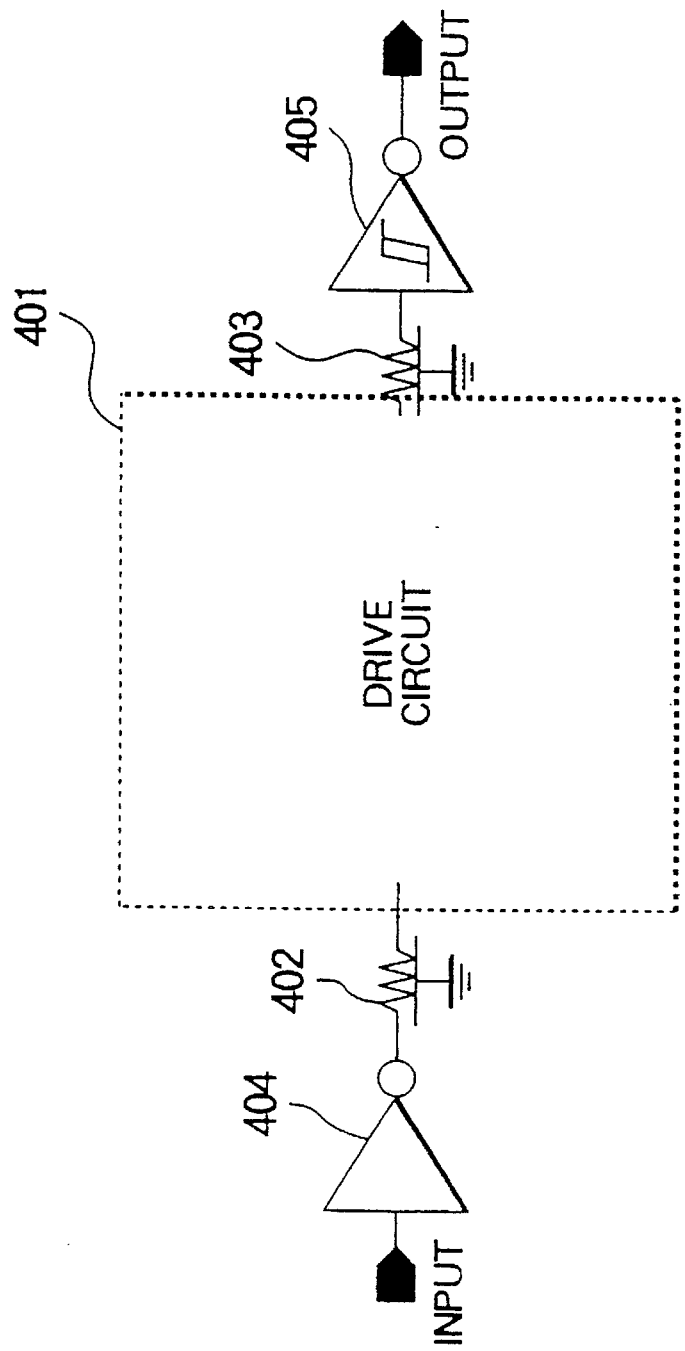
FIG. 17 is an example of a circuit using a drive circuit according to the present invention.

FIG. 17 shows an example of utilization of a drive circuit according to the present invention. The drive circuit 401 is interposed between a first signal line 402 driven by a drive circuit 404 and a second signal line 403 connected to the input of a Schmitt trigger 405. The drive circuit receives the input signal so as to recover the signal delay in the signal lines 402, thereby obtaining a high-speed signal transmission between the drive circuit 404 and the Schmitt trigger 405.

In the embodiments as described above, the first circuit section functions for supplying an output signal for controlling the direction of a signal transition and controls the fourth circuit portion of the second circuit section to accelerate the signal transition of the output of tile third circuit portion of the second circuit section.

Although the present invention is described with reference to the preferred embodiments thereof, the present invention is not limited to the above embodiments because the above embodiments can be easily modified within the scope of the present invention.

For example, the drive circuit according to the present invention may be such that a first circuit section is implemented by a first circuit portion responding to an input signal at a low-speed and a second circuit portion accelerating the output of the first circuit portion during a final stage of the signal transition of the input of the first circuit section so as to generate the delayed output of the first circuit section. In this text, such a second circuit portion is also described as having a function for delaying the output of the first circuit section.

What is claimed is:

1. A drive circuit for detecting a slow signal transition, comprising:

first and second circuit sections each having an input connected to an input signal line, said first circuit section comprising:

a first circuit portion for detecting a transient state of an input signal, said first circuit portion responding to said input signal supplied through said input signal line to generate a first output signal at a first output of said first circuit section; and a second circuit portion coupled to said first circuit portion for delaying the first output signal of said first circuit section during an initial stage of a transient period for the input signal to produce a time delay of said first output signal from said first circuit section, said second circuit section comprising:

a third circuit portion for detecting transient state of said input signal, said third circuit portion responding to the input signal to generate a second output signal at a second output, and a fourth circuit portion coupled between said first output and said second output, responsive to the time delay of said first output signal of said first circuit section, for accelerating said slow signal transition of the second output signal.

2. A drive circuit as defined in claim 1 further comprising a third circuit section, connected to said input signal line, controlled by the first output and the second output to charge or discharge said input signal line at least during said initial stage.

3. A drive circuit as defined in claim 2 further comprising a comparator section for comparing the first output and the second output.

4. A drive circuit as defined in claim 1 further comprising third and fourth circuit sections, said fourth circuit section coupled between said input signal line and said first and second circuit sections, for disconnecting said input signal line from the inputs of said first and second circuit sections at least during said initial stage, said third circuit section, coupled to said input line and controlled by the first and second output, for charging or discharging said inputs of said first and second circuit sections at least during said initial stage, 5. A drive circuit as defined in claim 4 further comprising a comparator section for comparing the first output and the second output.

6. A drive circuit as defined in claim 1 further comprising a comparator section for comparing the first output and the second output.

7. A drive circuit as defined in claim 1 further comprising:

a first inverter receiving the first output of said first circuit section for providing a first delay output, said first circuit portion comprising:

serially connected first and second P-channel transistors, and serially connected first and second N-channel transistors each having a gate receiving the input signal.

said second circuit portion comprising:

a third P-channel transistor and a third N-channel transistor connected in parallel to said first P-channel transistor and said second N-channel transistor, respectively, wherein said third P-channel transistor and said third N-channel transistor have a gate for receiving the output of said first inverter.

8. A drive circuit as defined in claim 7, wherein said third circuit portion comprises:

serially connected fourth and fifth P-channel transistors and serially connected fourth and fifth N-channel transistors connected between first and second potential lines, and wherein said fourth circuit portion comprises:

a sixth P-channel transistor connected in parallel to said fourth P-channel transistor, a sixth N-channel transistor connected in parallel to said fifth N-channel transistor, wherein said sixth P-channel transistor and said sixth N-channel transistor have a gate for receiving the time delay of said first output signal.

9. A drive circuit as defined in claim 2 wherein said third circuit section comprises:

serially connected first and second P-channel transistors connected between a first potential line and the input signal line, serially connected first and second N-channel transistors connected between a second potential line and the input signal line, each of said first P-channel transistors and second N-channel transistors having a gate receiving the second output, each of said second P-channel transistors and first N-channel transistors having a gain receiving an inverted signal of said first output signal.

10. A drive circuit as defined in claim 1 wherein said first circuit portion comprises:

serially connected first and second P-channel transistors, and serially connected first and second N-channel transistors, said second circuit portion comprising:

a third P-channel transistor connected between a first potential line and a first node connecting current paths of said first and second P-channel transistors, and a third N-channel transistor connected between a second potential line and a second node connecting current paths of said first and second N-channel transistors, each of said third P-channel transistor and third N-channel transistor having a gate connected to the output of said first inverter.

* * * * *